US010375851B2

(12) United States Patent
Agnaou et al.

(10) Patent No.: US 10,375,851 B2
(45) Date of Patent: Aug. 6, 2019

(54) ELECTRICAL CABINET WITH IMPROVED HEAT DISSIPATION

(71) Applicant: SCHNEIDER ELECTRIC INDUSTRIES SAS, Rueil-Malmaison (FR)

(72) Inventors: Abderrahmane Agnaou, Grenoble (FR); Olivier Wasner, Echirolles (FR); Alain Perrin, Saint Nicolas de Macherin (FR); Dominique Socquet, Biviers (FR); Jerome Laye, Grenoble (FR); Pascal Lepretre, Les Marches (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 601 days.

(21) Appl. No.: 14/196,347

(22) Filed: Mar. 4, 2014

(65) Prior Publication Data
US 2014/0260397 A1  Sep. 18, 2014

(30) Foreign Application Priority Data

Mar. 12, 2013  (FR) ...................... 13 52177

(51) Int. Cl.
*H05K 7/20* (2006.01)
*H02B 1/56* (2006.01)

(52) U.S. Cl.
CPC ......... *H05K 7/20145* (2013.01); *H02B 1/565* (2013.01); *H05K 7/202* (2013.01);
(Continued)

(58) Field of Classification Search
CPC .... H05K 7/20518; H05K 7/202; H05K 7/206; H05K 7/20609; H05K 7/20909;
(Continued)

(56) References Cited

U.S. PATENT DOCUMENTS 2,187,011 A * 1/1940 Braden ................... H03L 1/04
62/285
3,364,838 A   1/1968 Bradley
(Continued)

FOREIGN PATENT DOCUMENTS

DE   10 2009 054 011 A1   5/2011

OTHER PUBLICATIONS

French Preliminary Search Report dated Sep. 10, 2013, in French Application No. 13 52177 filed Mar. 12, 2013 (with English Translation of Categories of Documents).

*Primary Examiner* — Orlando E Aviles
(74) *Attorney, Agent, or Firm* — Oblon, McClelland, Maier & Neustadt, L.L.P.

(57) ABSTRACT

An electric cabinet that includes a front part and a rear part, and designed to receive removable electric functional units, further including: a separating partition delineating a first thermal area formed by a first space located at the front part of the electric cabinet, the first thermal area being designed to receive first electric apparatuses of the removable electric functional units, and a second thermal area formed by a second space located at the rear part of the cabinet, the second thermal area being designed to receive second electric apparatuses of the removable electric functional units, and the second thermal area is hotter than the first thermal area, and the first electric apparatuses heat more than the second electric apparatuses, the electric cabinet further includes a cooling source; and an actuator allowing air to flow.

9 Claims, 5 Drawing Sheets

(52) U.S. Cl.
CPC ......... *H05K 7/206* (2013.01); *H05K 7/20518* (2013.01); *H05K 7/20909* (2013.01)

(58) Field of Classification Search
CPC ........... H05K 7/20145; H05K 7/20563; H05K 7/20154; H05K 7/20172
See application file for complete search history.

(56) References Cited

U.S. PATENT DOCUMENTS

| | | | | |
|---|---|---|---|---|
| 3,807,493 | A * | 4/1974 | Stewart | F28D 15/0275 165/104.14 |
| 4,535,386 | A * | 8/1985 | Frey, Jr. | H05K 7/206 165/104.33 |
| 5,706,668 | A * | 1/1998 | Hilpert | H05K 7/20536 62/259.2 |
| 6,164,369 | A | 12/2000 | Stoller | |
| 6,205,796 | B1 * | 3/2001 | Chu | F25B 5/02 361/700 |
| 6,341,064 | B1 | 1/2002 | Bradley | |
| 2002/0154481 | A1 * | 10/2002 | Wagner | H05K 7/20145 361/694 |
| 2004/0217072 | A1 * | 11/2004 | Bash | H05K 7/20718 211/26 |
| 2006/0044756 | A1 * | 3/2006 | Wong | H05K 7/20909 361/695 |
| 2011/0085302 | A1 * | 4/2011 | Nakamichi | H05K 7/20972 361/695 |
| 2011/0235272 | A1 * | 9/2011 | Bash | H05K 7/20609 361/692 |

* cited by examiner

ELECTRICAL CABINET WITH IMPROVED HEAT DISSIPATION

BACKGROUND OF THE INVENTION

The invention relates to an electric cabinet with improved heat dissipation. The electric cabinet comprising a front part and a rear part is designed to receive electric functional units each comprising electric apparatuses. Said electric cabinet also comprises a separating partition delineating a first cold thermal area and a second hot thermal area. The first area is formed by a first space located at the front part of the cabinet, said cold area being designed to receive electric apparatuses or parts of apparatuses which do not heat or which heat very little. The second thermal area is formed by a second space located at the rear part of the cabinet, said cold area being designed to receive apparatuses or parts of apparatuses which are subject to temperature rises.

STATE OF THE PRIOR ART

It is known to install electric equipment units on a support frame fixed to the rear of an electric cabinet. Cooling is then performed in traditional manner via the front to the rear where the equipment units are located. Since that all the equipments are installed on the same frame at the back of the cabinet, the equipments which dissipate a large amount of heat are then mixed with the equipments that do not dissipate much heat. Furthermore, the equipments that are not very sensitive to heat and are able to operate at high temperatures are thus mixed with extremely heat-sensitive equipments. This type of installation implies a common cooling system requiring a good deal of power. The useful energy consumptions for this type of installation are thus considerable to ensure a provision of cool air which is not necessary for all the installed equipments. Furthermore, the greater the power of the cooling production systems or equipment is, the greater the risks of clogging of the filtering systems are.

An electric cabinet proposing a solution to improve cooling of the electric apparatuses housed in the electric cabinet is known from the document referenced DE102009054011A1. This solution consists:
   in separating the cabinet into two spaces, a first space located at the front comprising electric apparatuses to be cooled, and a second space located at the rear and comprising an inlet of cold air coming from the outside and a ventilation system enabling this cold air coming from the outside to be made to circulate efficiently and,
   in making openings between the different electric apparatuses to enable the cold air to flow from the second space to the first space and to blow over all the electric apparatuses. The openings are for example extended by trunkings in order to convey the air flow to the immediate proximity of the area of the electric apparatus to be cooled.

In this solution, all the parts of the electric apparatuses are destined to be at the same temperature whereas all the electric apparatuses do not necessarily require the same cooling level. In addition, this solution is not suitable for an assembly installation comprising cabinets which are juxtaposed or fixed against a wall or a framework (non-accessibility of the cabinet via the rear).

SUMMARY OF THE INVENTION

The object of the invention is therefore to remedy the shortcomings of the state of the art so as to propose an electric cabinet having an optimized thermal architecture due to an intelligent distribution of the heat sources and of the dissipation systems.

The electric cabinet according to the invention comprises a cooling and regulation device of the temperature of the first and second spaces. Said device comprises a cooling source positioned in contact with the first space to cool the latter, and heat exchange means allowing cold air to pass between the first space and the second space to cool the second hot thermal area with cold air from the first cold thermal area.

Preferably, the heat exchange means are positioned on the separating partition.

According to a mode of development of the invention, the heat exchange means are active and regulated so as to transfer cold air according to a fixed setpoint temperature in the second space.

Preferably, the regulated heat exchange means comprise at least one controlled actuator connected to a processing unit, said actuator being designed to make the air flow circulate from the first space to the second space.

According to one embodiment of the invention, the cooling source in contact with the first space is positioned on a panel of the electric cabinet.

Advantageously, the volume of the first space is modulable.

Preferably, the electric cabinet comprises fixing means arranged to receive electric functional units, said units forming the separating partition.

Preferably, the electric functional units each comprise a support supporting several electric apparatuses.

Preferably, an electric functional unit comprises an electric apparatus passing through the separating partition so as to dispose a first part located in the first space and a second part located in the second space.

Advantageously, the second part of the electric apparatus comprises a ventilation system in the second space.

BRIEF DESCRIPTION OF THE DRAWINGS

Other advantages and features will become more clearly apparent from the following description of particular embodiments of the invention, given for non-restrictive example purposes only, and represented in the appended drawings in which.

DETAILED DESCRIPTION OF AN EMBODIMENT

Figure 1:
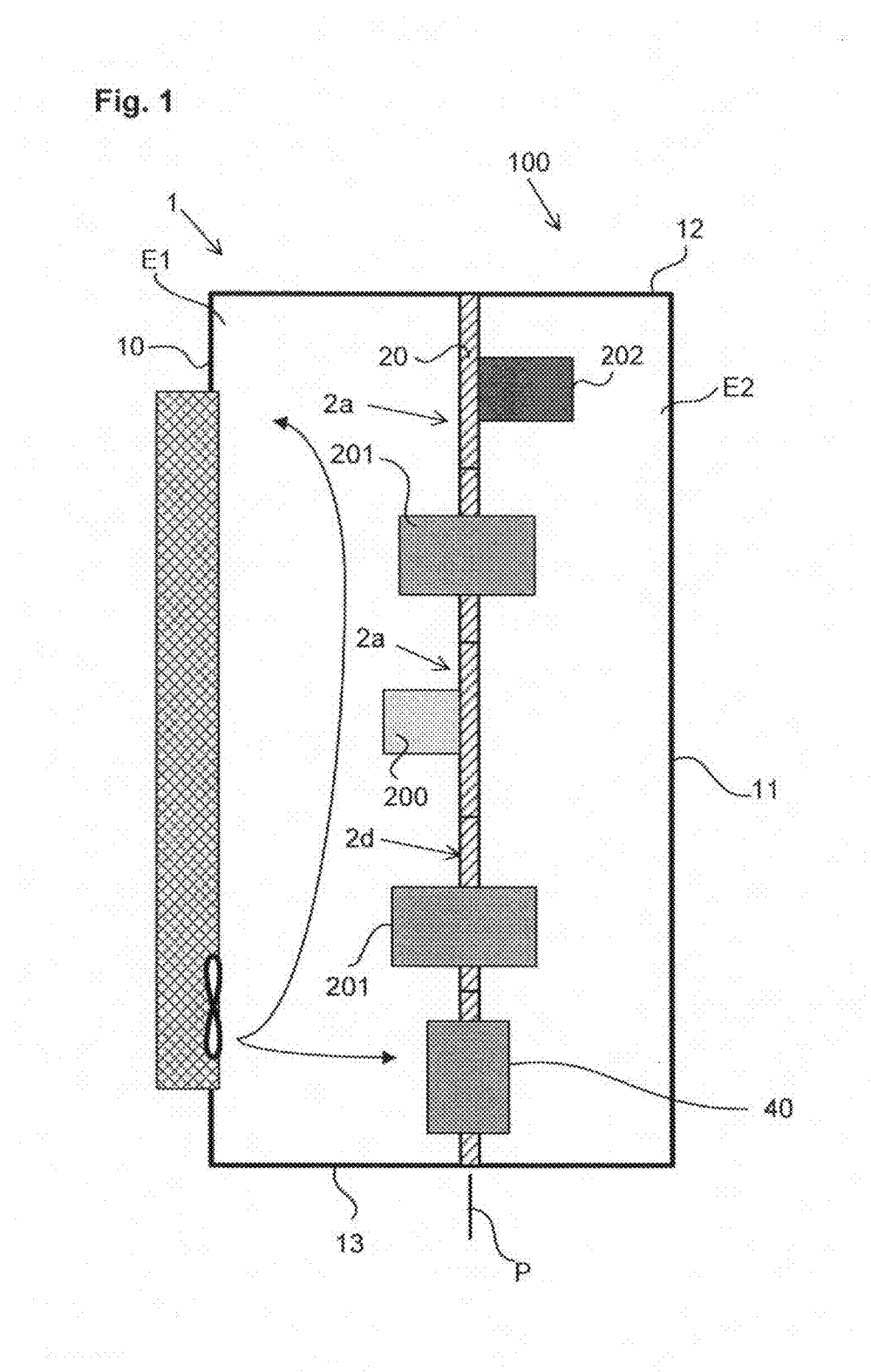
FIG. 1 represents a side view of the innards of the electric cabinet according to a first preferred embodiment of the invention.
Figure 2:
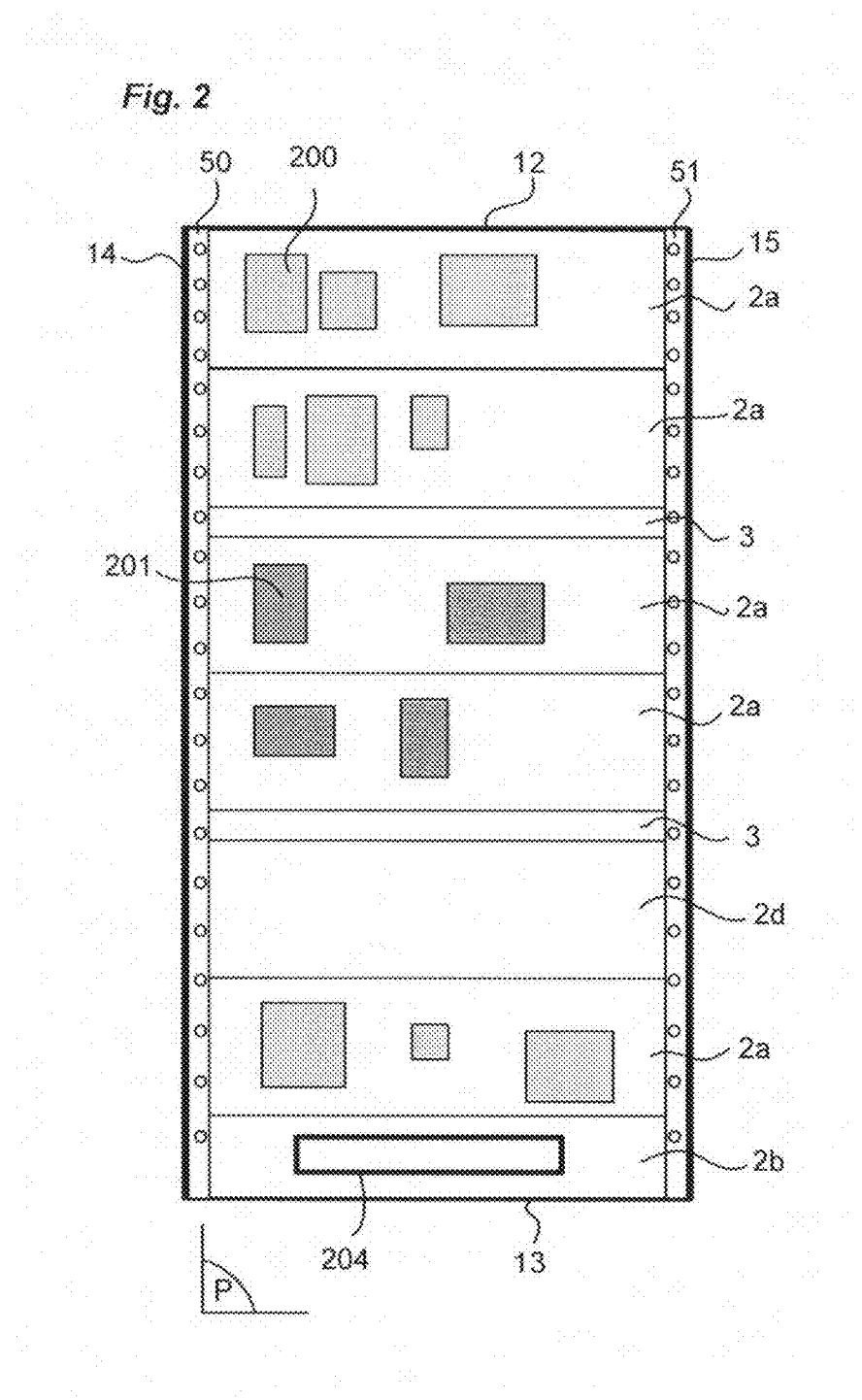
FIG. 2 represents a front view of the innards of the electric cabinet according to FIG. 1.

The invention relates to an electric cabinet 1. The electric cabinet 1 is preferably of rectangular shape. Naturally, a cabinet that is cylindrical or has a circular cross-section or a cross-section of a different shape could quite naturally be envisaged. This principle also applies to any electric panel the protective enclosure of which is formed by the frame of the equipment with complex shapes. In the remainder of the description, an electric cabinet of rectangular shape will be dealt with. The electric cabinet thus comprises a front panel 10, a rear panel 11, a top panel 12, a bottom panel 13 and two side panels.

The front panel 10 of the electric cabinet 1 for example comprises a door for access to the inside of the cabinet.

The electric cabinet 1 of the invention can in particular be tightly sealed, for example in compliance with the IEC 60529 standard with an ingress protection rating IP55. The heat dissipation solution described below is particularly suitable for cooling electric apparatuses housed in a tightly sealed electric cabinet of this type, but it must be understood that it can be adapted to an enclosure that is not tightly sealed or that has a different ingress protection rating.

The inside of the electric cabinet according to the invention comprises a separating partition 20 between a first space E1 located at the front part of the electric cabinet 1 and a second space E2 located at the rear part of the electric cabinet 1. The separating partition 20 is preferably parallel to the front panel 10 and rear panel 11 of the electric cabinet 1.

According to the invention, on account of the presence of the separating partition 20, the inner volume of the electric cabinet 1 is divided into two distinct thermal areas:
- a first cold area formed by the first space E1 as it is designed to receive electric apparatuses or parts of apparatuses which do not heat or heat very little. Furthermore, these apparatuses are generally sensitive to heat and tend to operate in optimal manner when the temperature is limited.
- a second hot area formed by the second space E2 as it is designed to receive electric apparatuses or parts of apparatuses which heat. Furthermore, these apparatuses generally have a low heat sensitivity and tend to operate in optimal manner even if the temperature is higher.

Preferably, the first space E1 can be modulated to adjust its volume to the installation requirements of the apparatuses and to the thermal stresses.

According to a preferred embodiment of the invention, the electric cabinet comprises a cooling and regulating device of the temperature of the first and second spaces E1, E2. The cooling and regulating device is designed:
- on the one hand to set and regulate a first operating temperature T1 within the first space E1;
- on the other hand to set and regulate a second operating temperature T2 within the second space E2.

The second operating temperature T2 is higher than the first operating temperature T1.

According to a preferred embodiment of the invention, the cooling and regulating device comprises a cooling source 100 and regulated heat exchange means 40.

The cooling source 100 is positioned in contact with the first space E1 to cool the latter. What is meant by being "in contact with" the first space E1 is the fact that the cold air produced by said cooling source 100 is designed to cool said first space.

Figure 5:
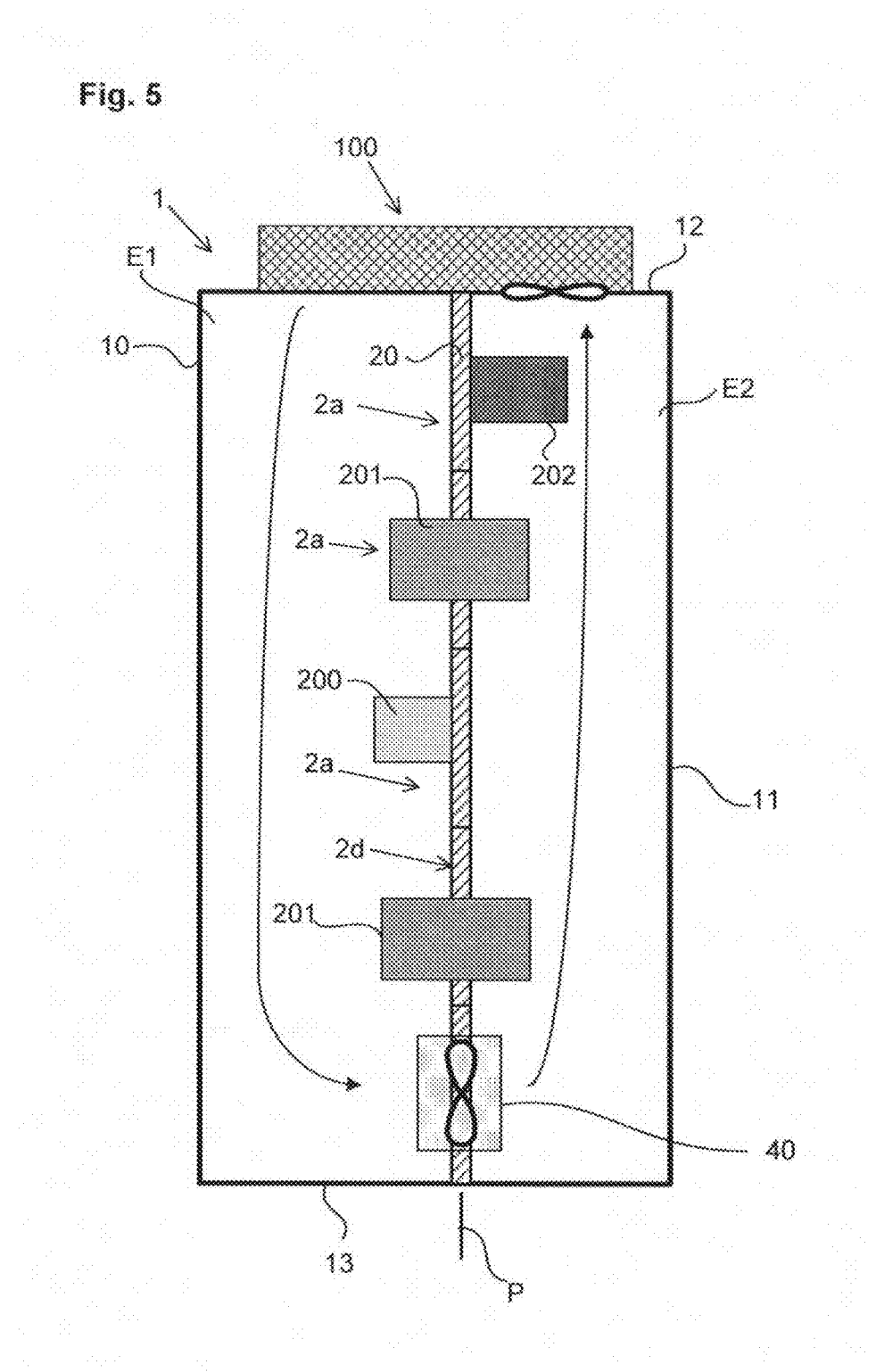
FIG. 5 represents a side view of another alternative embodiment of the electric cabinet according to FIG. 1.

According to its position relative to the electric cabinet, the cooling source 100 is arranged for:
- extracting air from the first space E1, cooling this air and injecting cooled air in the first space (FIG. 1), or
- extracting air from the second space E2, cooling this air and injecting cooled air in the first space E1 (FIG. 5).

According to a first exemplary embodiment represented in FIG. 1, the cooling source 100 is fixed to the front panel 10 of the cabinet. For example, the cooling source 100 comprises an air-conditioning unit fixed onto the access door of the cabinet.

According to another embodiment of the invention, the cooling source 100, for instance the air-conditioning unit, is fastened on one of the two side panels of the electric cabinet.

According to another embodiment of the invention showed on FIG. 5, the cooling source 100, for instance the air-conditioning unit, is fastened on the top panel 12 of the electric cabinet. The air to be cooled is then extracted from the second space E2 and the cooled air is injected in the first space E1.

According to a second exemplary embodiment that is not represented, the cooling source 100 is positioned in proximity to the first space E1 so that a ventilation duct directly connects said cooling source to the first cold area formed by the first space E1.

For example, the cooling source comprises an air-conditioning unit fixed onto the access door of the cabinet. In order to take the installation requirements of the electric cabinet into account, heat removal can be performed via one or more panels of the cabinet.

According to this preferred embodiment of the invention, the cooling and regulating device comprises heat exchange means 40. The heat exchange means 40 are designed to transfer cold air from the first space E1 to the second space E2. As an example of operation, the first operating temperature T1 of the cold area of the first space E1 is regulated at a temperature of 35° C. The hot area is cooled by means of one or more heat exchange means 40. These means enable the cold air strictly necessary for the hot area to be transferred to ensure a second most critical operating temperature T2 (that of the most sensitive apparatus), for example at 50° C.

According to a first development mode of the invention, the heat exchange means 40 are active and regulated so as to transfer cold air according to a fixed setpoint temperature in the second space E2. The regulated heat exchange means 40 preferably comprise at least one controlled actuator connected to a processing unit (not shown). The processing unit is designed to act on the actuator of the regulated heat exchange means 40 according to the second operating temperature T2 measured in the second space E2. The regulated heat exchange means 40 preferably comprise a thermostat installed for example in the middle of the hot area at ⅔ of the height and connected to the actuator. If the thermostat measures a higher second operating temperature T2 than a setpoint temperature (for example 50° C.), a processing unit triggers the actuator so as to transfer cold air to the hot area. According to a first exemplary embodiment, the actuator preferably comprises a fan positioned on the separating partition 20. According to another exemplary embodiment, the actuator of the regulated heat exchange means 40 comprises an aperture associated with a swivelling shutter commanded to opening and/or closing. The aperture and shutter are positioned on the separating partition 20. The shutter is advantageously engineered to direct the flow of cold air upwards on the side occupied by the space E2 in order to enhance transmission of the flow of colder air to the hot spots. It may be positioned at a different height on the partition 20 in order to start cooling a particular equipment item in preferential manner.

According to a second development mode of the invention, the heat exchange means 40 are passive. The regulated exchange means 40 comprise at least one calibrated opening positioned on the partition 20. The size of the opening is calibrated according to the layout of the electric apparatuses present in the electric cabinet. The size of the opening is also calibrated according to the operating cycle of said apparatuses.

According to a preferred development mode of the invention, the separating partition 20 between the first and second spaces E1, E2 comprises several removable functional units 2a, 2b respectively comprising a suitable support to be able to be fixed onto fixing means for example formed by two parallel vertical uprights 50, 51. According to this exemplary embodiment, the two vertical uprights are positioned in a plane, called separating plane P, for example parallel to the front panel 10 and rear panel 11 of the electric cabinet 1. According to the invention, each functional unit support, fixed in removable manner on the fixing means, presents two surfaces parallel to the separating plane P, a front surface located on the same side as the first space E1 and a rear surface located on the same side as the second space E2. A set of functional units 2a, 2b placed at the level of the separating plane P is for example arranged to form the separating partition 20.

The functional units 2a, 2b are positioned in adjacent manner in the separating plane P so as to form the separating partition 20. This separating partition can be natively insulating or becoming insulating with the addition of a thermal insulation when the power dissipated by the apparatuses in the second space E2 is much greater than the power dissipated in the first space E1. Dummy functional units 2d (FIG. 1), not supporting any apparatus or element, can also be provided to form the complete separating partition 20 over the whole height of the electric cabinet 1. Naturally, to make the volumes of the two spaces E1, E2 vary, the depthwise position of the uprights, and therefore of the separating partition, can be adjusted.

The functional units can in particular be electric functional units 2a, ventilation functional units 2b and/or cooling functional units (not illustrated). These functional units are combined in the cabinet taking the applications to be controlled or monitored and the different stresses, in particular the thermal stresses, into account. Each functional unit can for example perform instrumentation and control, ventilation or cooling functions. What is meant by electric functional unit 2a is a functional unit that comprises one or more electric apparatuses, such as for example a circuit breaker, an electromechanical contactor, a motor feeder, a variable speed drive, a starter motor, a filter or a braking resistance, automatic control components such as controllers, input-output modules and/or communication islands. Electric apparatuses of this type are for example grouped together in an electric functional unit 2a according to their function and/or their thermal characteristics.

Certain electric functional units 2a comprise electric instrumentation/control apparatuses 200 that do not comprise a built-in heat dissipation system but which are at the same time sensitive to temperature. Thus, as represented in FIG. 1, said electric apparatuses are then placed in the first space E1.

Other electric functional units can comprise electric power apparatuses 201 that are liable to heat considerably and which therefore have to be cooled.

With reference to FIG. 1, depending on the type of electric apparatus used on the electric functional units 2a, several arrangements are possible.

Certain electric apparatuses will be completely located in the first space E1, i.e. fixed onto the front surface of the support of the electric functional unit 2a. These electric apparatuses present in the first space E1 are for example instrumentation and control apparatuses 200 such as circuit breakers or electromechanical contactors, controllers, and so on.

Certain electric apparatuses will be located in the second space E2 only, i.e. fixed onto the rear surface of the support of the electric functional unit 2a. These electric apparatuses 202 present only in the second space E2 are for example smoothing inductors or braking resistances, transformers or other passive components. Other systems able to dissipate heat such as electric power distribution systems for example are fitted in the area E2.

On a functional unit it is possible to fit apparatuses of different sensitivity, on both surfaces, designed to be placed on area E1 or E2.

Certain electric apparatuses will be able to pass through their support so as to present a first part located in the first space E1 and a second part located in the second space E2. These electric apparatuses located partly in the first space and partly in the second space E2 are for example power dissipating apparatuses 201 of variable speed drive, progressive starter, power supply, motion controller, inverter type. The monitoring part of these apparatuses is located at the front and the power part equipped with the power transistors is located at the rear. The power part can in particular comprise an integrated ventilation system.

In a particular configuration that is not represented, openings are distributed between certain functional units to make the first space E1 communicate with the second space E2. An air flow can thus circulate from the cold area to the hot area via one or more openings.

Figure 4:
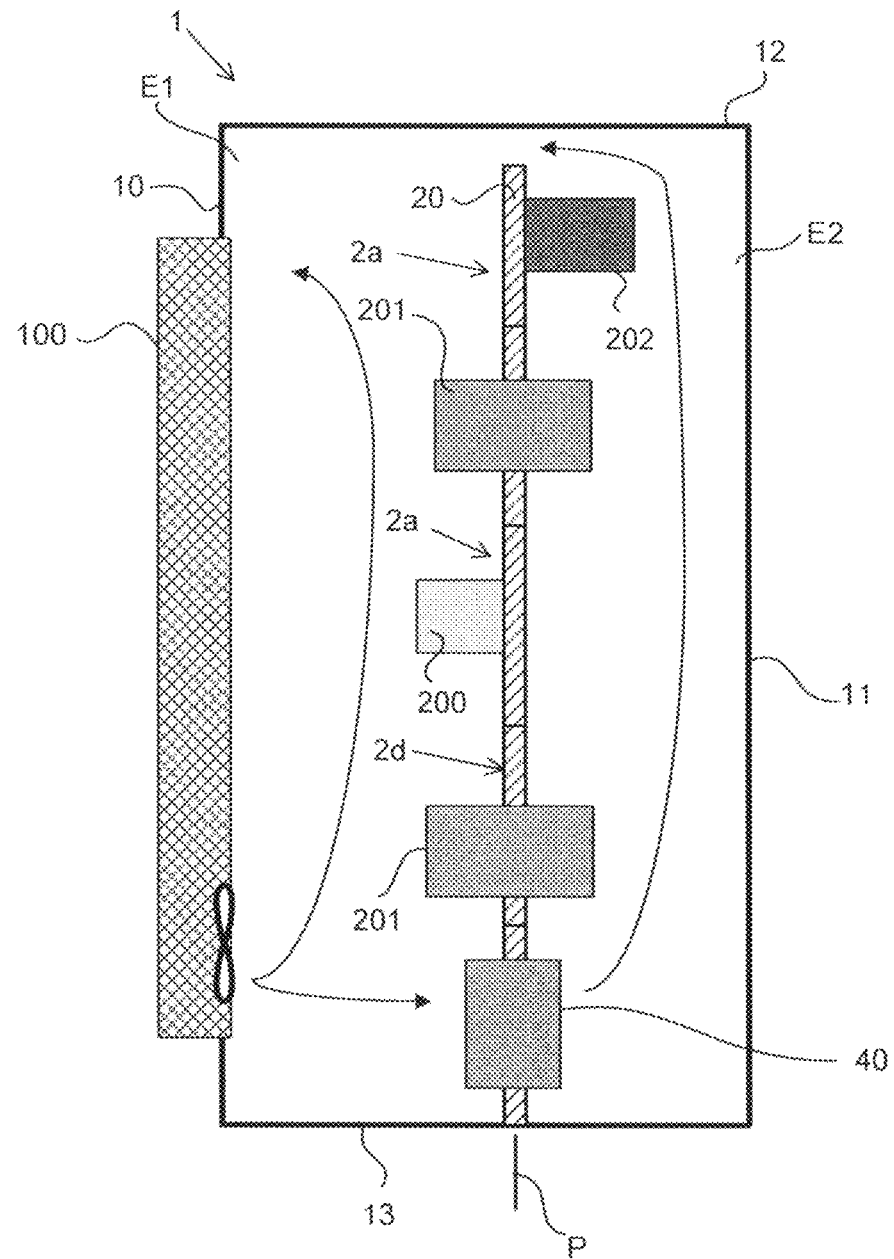
FIG. 4 represents a side view of another alternative embodiment of the electric cabinet according to FIG. 1.

In the opposite manner, as represented in FIG. 4, openings may be provided at the top of the cabinet to make the air flow from the hot area to the cold area by backflow produced by the heat exchange means 40, for example a transfer fan. The fan creates a pressure in the hot part, and this opening enables pressure relief (controlled air circulation).

In the embodiment of FIG. 5, in which the cooling source 100 is fastened on the top panel 12 of the electric cabinet, a fan solution is used to extract hot air from the second space, this air being cooled and injected by the cooling source 100 in the first space.

Figure 3:
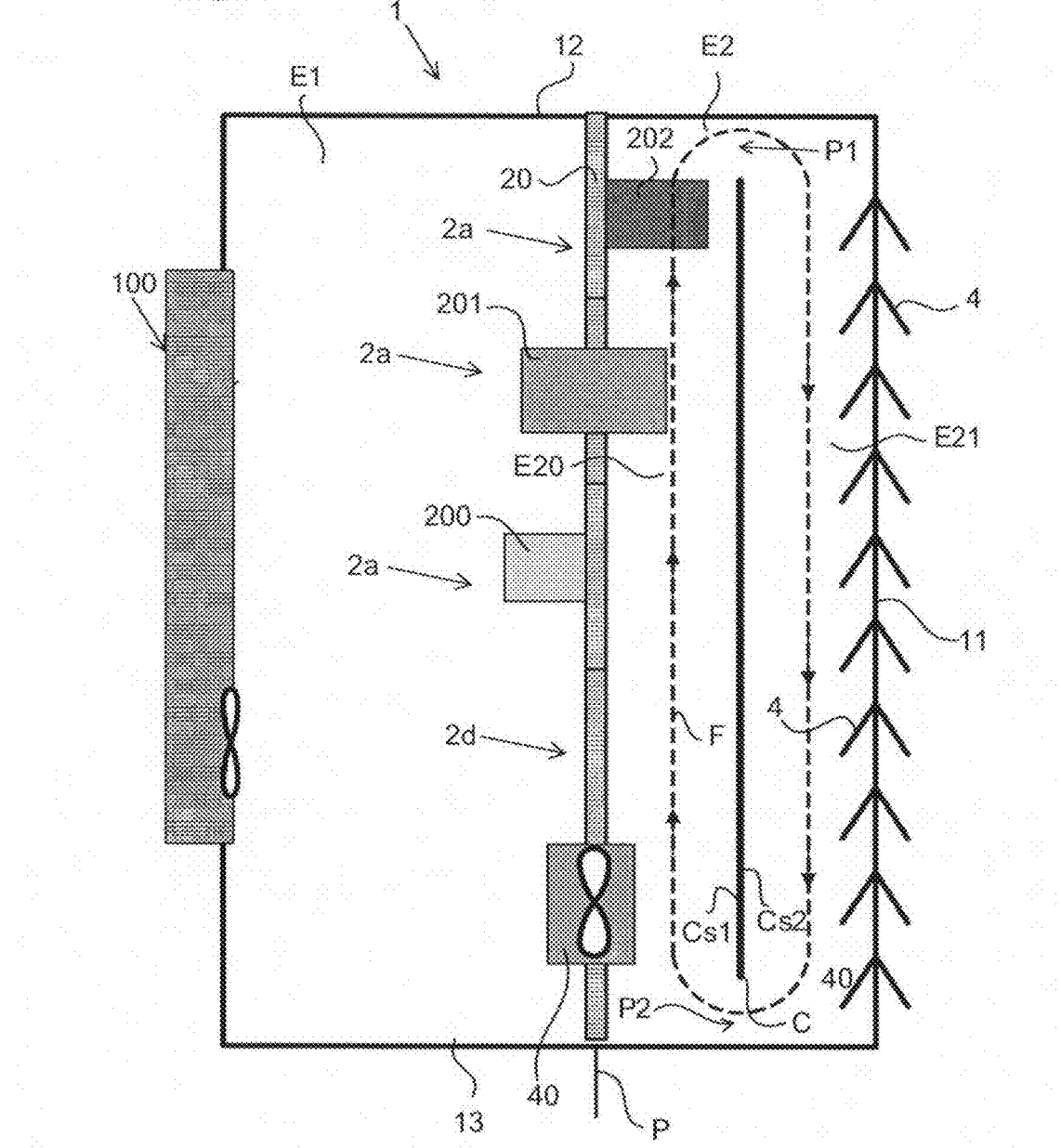
FIG. 3 represents a side view of an alternative embodiment of the electric cabinet according to FIG. 1.

According to an alternative embodiment of the invention as represented in FIG. 3, the electric cabinet 1 also comprises a partition C, in the second space E2, extending in a vertical plane parallel to the separating plane P. This partition C thus enables the second space E2 to be divided into a first sub-space E20 located at the front part of the electric cabinet 1 and a second sub-space E21 located at the rear part of the electric cabinet 1. The position of this partition is adjustable in depth to be able to make the volumes of the two sub-spaces E20, E21 vary. This partition C is fixed inside the electric cabinet 1 so as to leave at least two passages P1, P2 enabling an air flow to circulate between the first sub-space E20 and the second sub-space E21. Preferably, a first passage P1 is made at the top of the electric cabinet 1 and a second passage P2 is made in the bottom of the electric cabinet. The partition C comprises a front surface Cs1 located on the same side as the first sub-space E20 of the second space and a rear surface Cs2 located on the same side as the second sub-space E21 of the second space. The position of the partition C is also adjustable in height so as to be able to make the size of the passages P1, P2 vary.

According to an alternative embodiment of the invention, the electric cabinet 1 can be equipped with materials of different thermal conductivities on the part of the second space E2. The choice can be made according to the external temperature of the cabinet. The partitions can comprise heat exchange fins 4 so as to increase the heat exchange surface. For example purposes, heat exchange fins can thus be positioned on the rear panel 11 of the electric cabinet 1, on the outer surface of the latter and/or on the inner surface of the latter.

According to the invention, the different characteristics of the electric cabinet 1 presented above in the different configurations represented in the figures can easily be combined with one another to adapt to the electric apparatuses housed in the electric cabinet, to the situation and to the environment of the electric cabinet.

The invention claimed is:

1. An electric cabinet designed to receive removable electric functional units, said electric cabinet comprising:
    a front panel;
    a rear panel;
    a top panel;
    a bottom panel; and
    a separating partition delineating:
        a first thermal area formed by a first space located closer to the front panel than the rear panel of the electric cabinet, said first thermal area being designed to receive first electric apparatuses or parts of the first electric apparatuses of the removable electric functional units, the front panel, the top panel, the bottom panel and the separating partition enclosing the first space, and
        a second thermal area formed by a second space located closer to the rear panel than the front panel of the electric cabinet, said second thermal area being designed to receive second electric apparatuses or pans of the second electric apparatuses of the removable electric functional units, the rear panel, the top panel, the bottom panel and the separating partition enclosing the second space, wherein
    the separating partition comprises the removable electric functional units,
    the electric cabinet further comprises a cooling and regulating device of temperature of the first and second spaces, said cooling and regulating device comprising:
        an air-conditioner positioned in contact with the first space of the first thermal area to cool the first space without being in physical contact with the second space of the second thermal area, the air-conditioner being positioned within the front panel; and
        a computer controlled actuator that is designed configured to be operated to allow air to flow from the first space to the second space to cool the second thermal area with air from the first thermal area when a measured temperature of the second thermal area is higher that the critical operating temperature of a most sensitive apparatus of the second electrical apparatuses or parts of the second electric apparatuses, the actuator being positioned in the separating partition of the electric cabinet, the actuator being positioned closer to the bottom panel than the top panel.

2. The electric cabinet according to claim 1, wherein the actuator is connected to processing circuitry, said actuator being configured to make the air flow circulate from the first space to the second space.

3. The electric cabinet according to claim 1, characterized in that a volume of the first space is modulable.

4. The electric cabinet according to claim 1, wherein the removable electric functional units each comprises a support supporting at least one of the first electric apparatuses or the parts of the first electric apparatuses and the second electric apparatuses or the parts of the second electric apparatuses.

5. The electric cabinet according to claim 1, wherein the removable functional units comprise an electric apparatus passing through the separating partition so as to arrange a first part located in the first space and a second part located in the second space.

6. The electric cabinet according to claim 5, wherein the second part comprises a ventilation system in the second space.

7. The electric cabinet according to claim 1, wherein
    the separating partition is extending from the bottom panel of the electric cabinet toward the top panel of the electric cabinet, and
    an opening connecting the first space and the second space is provided in an area closer to the top panel than the bottom panel.

8. The electric cabinet according to claim 1, wherein
    the separating partition is extending from the bottom panel of the electric cabinet toward the top panel of the electric cabinet, and
    an opening connecting the first space and the second space is provided between the separating partition and the top panel.

9. The electric cabinet according to claim 1, wherein the air-conditioner is further configured to exhaust heat to outside the electric cabinet.

* * * * *

UNITED STATES PATENT AND TRADEMARK OFFICE
CERTIFICATE OF CORRECTION

PATENT NO. : 10,375,851 B2  
APPLICATION NO. : 14/196347  
DATED : August 6, 2019  
INVENTOR(S) : Abderrahmane Agnaou et al.

Page 1 of 1

It is certified that error appears in the above-identified patent and that said Letters Patent is hereby corrected as shown below:

In the Claims

In Column 7, Line 30, Claim 1, delete "pans" and insert -- parts --;

In Column 7, Line 44, Claim 1, after "is" delete "designed";

In Column 8, Line 3, Claim 1, delete "that the" and insert -- than the --.

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*